United States Patent
Yao et al.

(10) Patent No.: US 9,543,289 B2
(45) Date of Patent: Jan. 10, 2017

(54) MANUFACTURING METHOD OF SEMICONDUCTOR DEVICE

(71) Applicant: FUJI ELECTRIC CO., LTD., Kawasaki (JP)

(72) Inventors: Noriaki Yao, Kanagawa (JP); Hitoshi Abe, Kanagawa (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 14/781,533

(22) PCT Filed: May 12, 2014

(86) PCT No.: PCT/JP2014/002501
§ 371 (c)(1),
(2) Date: Sep. 30, 2015

(87) PCT Pub. No.: WO2014/199558
PCT Pub. Date: Dec. 18, 2014

(65) Prior Publication Data
US 2016/0056144 A1    Feb. 25, 2016

(30) Foreign Application Priority Data
Jun. 12, 2013  (JP) .................................. 2013-123697

(51) Int. Cl.
*H01L 21/00* (2006.01)
*H01L 27/02* (2006.01)
(Continued)

(52) U.S. Cl.
CPC ..... *H01L 27/0255* (2013.01); *H01L 21/02532* (2013.01); *H01L 21/02595* (2013.01);
(Continued)

(58) Field of Classification Search
CPC ............ H01L 27/0255; H01L 27/0629; H01L 29/66136; H01L 29/66712; H01L 29/7804; H01L 29/861
(Continued)

(56) References Cited

U.S. PATENT DOCUMENTS

2011/0062545 A1    3/2011 Nakajima

FOREIGN PATENT DOCUMENTS

JP          3-34360      2/1991
JP       2002-190575    7/2002
(Continued)

OTHER PUBLICATIONS

PCT International Preliminary Report on Patentability dated Dec. 23, 2015 in corresponding International Patent Application No. PCT/JP2014/002501.
(Continued)

*Primary Examiner* — Brook Kebede (57) ABSTRACT

A manufacturing method of a semiconductor device includes: depositing a thin film semiconductor layer on a semiconductor substrate with an insulating film therebetween, the insulating film having been formed on a surface of the semiconductor substrate; ion-implanting first impurity ions into the thin film semiconductor layer under a condition where a range of the first impurity ions becomes smaller than a film thickness of the thin film semiconductor layer when being deposited; and selectively ion-implanting second impurity ions into the thin film semiconductor layer with a dose quantity more than a dose quantity of the first impurity ions, in which a diode for detecting temperature is formed by a region into which the first impurity ions have been implanted and a region into which the second impurity ions have been implanted in the thin film semiconductor layer.

15 Claims, 11 Drawing Sheets

(51) Int. Cl.
| | | |
|---|---|---|
| *H01L 29/861* | (2006.01) | |
| *H01L 29/66* | (2006.01) | |
| *H01L 27/06* | (2006.01) | |
| *H01L 21/265* | (2006.01) | |
| *H01L 29/423* | (2006.01) | |
| *H01L 29/78* | (2006.01) | |
| *H01L 27/12* | (2006.01) | |
| *H01L 21/02* | (2006.01) | |
| *H01L 21/324* | (2006.01) | |
| *H01L 21/822* | (2006.01) | |
| *H01L 23/34* | (2006.01) | |
| *H01L 29/167* | (2006.01) | |

(52) U.S. Cl.
CPC ...... *H01L 21/26513* (2013.01); *H01L 21/324* (2013.01); *H01L 21/822* (2013.01); *H01L 23/34* (2013.01); *H01L 27/0629* (2013.01); *H01L 27/1207* (2013.01); *H01L 29/167* (2013.01); *H01L 29/42356* (2013.01); *H01L 29/6609* (2013.01); *H01L 29/66348* (2013.01); *H01L 29/7827* (2013.01); *H01L 29/861* (2013.01); *H01L 2924/0002* (2013.01)

(58) Field of Classification Search
USPC .......................................... 438/54; 257/470
See application file for complete search history.

(56) References Cited

FOREIGN PATENT DOCUMENTS

| JP | 2002-368222 | 12/2002 |
| JP | 2003-69023 | 3/2003 |
| JP | 2007-294670 | 11/2007 |
| JP | 2010-287786 | 12/2010 |
| JP | 2011-66184 | 3/2011 |

OTHER PUBLICATIONS

International Search Report mailed Aug. 12, 2014, in corresponding International Application No. PCT/JP2014/002501.
Japanese Office Action dated Sep. 27, 2016 in corresponding Japanese Patent Application No. 2015-522490.

MANUFACTURING METHOD OF SEMICONDUCTOR DEVICE

CROSS-REFERENCE TO RELATED APPLICATIONS

This application is a U.S. National Stage Application, which claims the benefit under 35 U.S.C. §371 of PCT International Patent Application No. PCT/JP2014/002501, filed May 12, 2014, which claims the foreign priority benefit under 35 U.S.C. §119 of Japanese Patent Application No. 2013-123697, filed Jun. 12, 2013, the contents of which are incorporated herein by reference.

TECHNICAL FIELD

The present invention relates to a manufacturing method of a semiconductor device, more particularly to a technique that is effective when being applied to a manufacturing method of a semiconductor device having a main semiconductor element and a diode for detecting temperature, for immediately detecting an abnormal temperature increase during current application of the main semiconductor element and suppressing element destruction due to a thermal runaway, on the same semiconductor substrate.

BACKGROUND ART

When an insulated gate bipolar transistor (hereinafter, sometimes referred to as IGBT) is used in an inverter or the like, there is a mode where overvoltage and overcurrent are caused, which is called a load short. In order to avoid element destruction even when being caught in such a mode, it is desirable for a power device itself to have overvoltage and overcurrent resistance performance such as a function to detect abnormal heat generation due to overvoltage and overcurrent, without delay as much as possible. As such device, a device structure in which a main semiconductor element, such as a power IGBT or a power MOSFET in which a large current flows, and a diode for detecting temperature (temperature sensing diode) are integrally incorporated into the same semiconductor substrate is known.

Figure 11:
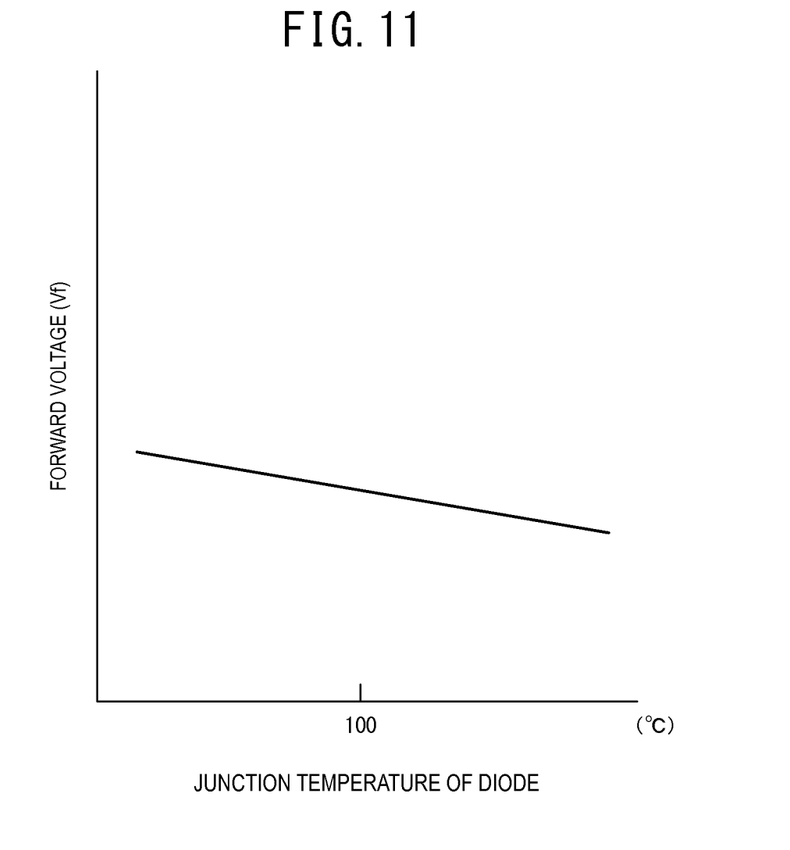
FIG. 11 is a relationship diagram illustrating a relationship between a junction temperature of a diode and a forward voltage.

As illustrated in FIG. 11, it is known that there is a relationship in which a forward direction voltage (hereinafter, forward voltage) of a diode is generally decreased linearly as temperature of an element is increased. By using this property, when a diode layer for detecting temperature is formed on the surface of a semiconductor substrate on which a main semiconductor element (hereinafter, referred to as main element) is mounted with an insulating film therebetween, a temperature change of the main element can be immediately detected as a voltage change. If the detected temperature of the main element exceeds allowable temperature of the main element, an operating current is limited by decreasing a gate voltage of the main element so that the main element can be protected from thermal destruction.

In contrast, a potential difference (Vf: forward voltage) generated between an anode (p region) and a cathode (n region) when passing a forward direction current through a diode for detecting temperature is a sum of a junction voltage Vpn generated in a pn junction part and a voltage drop (I×Rpn) generated by resistance of the p region and the n region. More specifically, Vf=Vpn+(I×Rpn). The resistance value Rpn of the p region and the n region is determined by impurity concentrations of the p region and then region, and thus, if there is variation in the impurity concentrations, variation occurs in the resistance value Rpn of the p region and the n region. As a result, variation occurs in temperature detection accuracy by the diode.

As a manufacturing method of such a diode for detecting temperature, which is integrated with a main element, for example, a manufacturing method in which a p-n junction diode is formed by impurity doping in a polycrystalline silicon layer grown on the surface of a substrate of a main semiconductor element with a silicon oxide film therebetween is known (PTL 1, 2).

In addition, a structure of a diode for detecting temperature (FIG. 6 in PTL 3), in which, when the diode made of respective p-n impurity layers adjacent to each other with a junction therebetween is formed by ion implantation and laser anneal in a polycrystalline silicon layer grown on the surface of a substrate of a main element with an insulating film therebetween, the polycrystalline silicon layer is left in the lower layer part of the p-n impurity layers, is disclosed (PTL 3).

In addition, a document describing details of a manufacturing process of a polysilicon diode is disclosed (PTL 4).

FIGS. 9A through 9E illustrate a conventional manufacturing method of a MOSFET having a diode for detecting temperature (temperature sensing diode). In FIGS. 9A through 9E, hatching indicating cross-sectional surfaces is partially omitted for making the drawing be easily recognized.

Figure 9A:
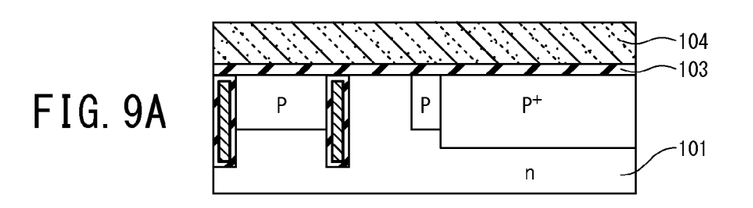
FIGS. 9A through 9E are main part cross-sectional diagrams for illustrating the conventional manufacturing process flow of the semiconductor device.

As illustrated in FIG. 9A, a polycrystalline silicon layer 104 is formed on the whole area of the surface of a semiconductor substrate 101 having an active region and an inactive region with an insulating film 103 therebetween. Here, a left region in which a main element is formed is the active region, and a right region in which the diode for detecting temperature is formed is the inactive region.

Figure 9B:
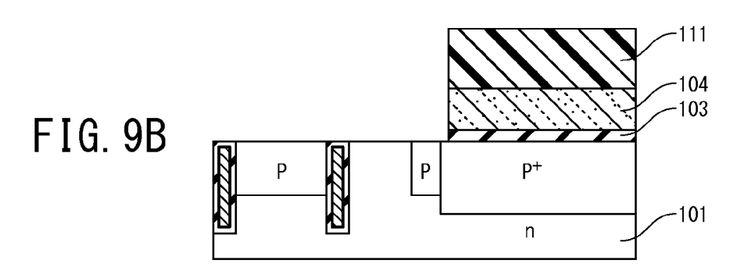

Then, as illustrated in FIG. 9B, by using a photoresist 111 as a mask, the polycrystalline silicon layer 104 and the insulating film 103 on the active region of the semiconductor substrate 101 are selectively removed.

Figure 9C:
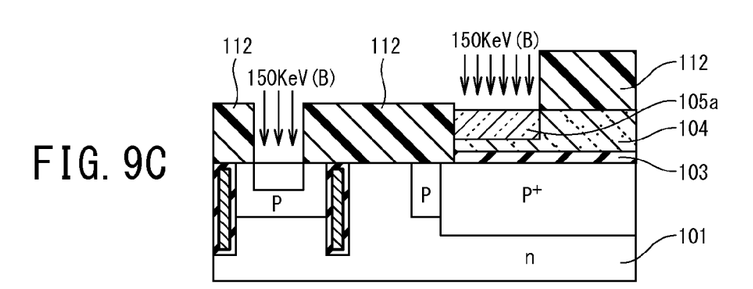

Furthermore, as illustrated in FIG. 9C, by using a photoresist 112 as a mask, boron (B) ions as impurity ions are selectively ion-implanted into the polycrystalline silicon layer 104 on the inactive region of the semiconductor substrate 101 and the active region of the semiconductor substrate 101 to form an impurity ion implantation layer 105a for the diode in the polycrystalline silicon layer 104 and to form an impurity ion implantation layer for the main element in the active region of the semiconductor substrate 101.

Figure 9D:
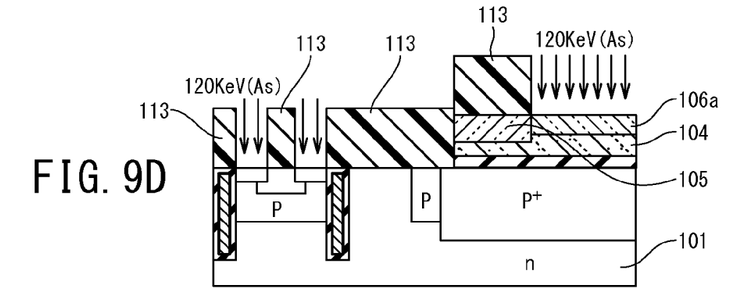

Then, as illustrated in FIG. 9D, by using a photoresist 113 as a mask, arsenic (As) ions as impurity ions are selectively ion-implanted into the polycrystalline silicon layer 104 on the inactive region of the semiconductor substrate 101 and the active region of the semiconductor substrate 101 to form an impurity ion implantation layer 106a for the diode in the polycrystalline silicon layer 104 and to form an impurity ion implantation layer for the main element in the active region of the semiconductor substrate 101.

Figure 9E:
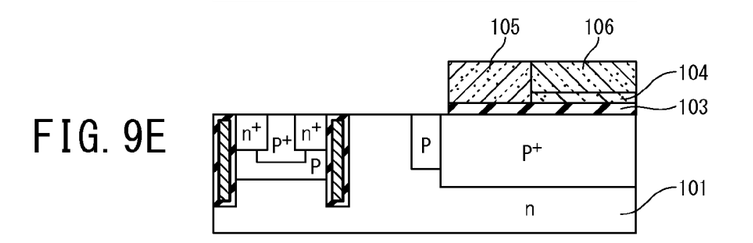

Then, as illustrated in FIG. 9E, by performing thermal treatment to activate the boron ions and the arsenic ions ion-implanted in FIG. 9C and FIG. 9D, a p region 105 and an n region 106 are formed in the polycrystalline silicon layer 104.

Here, in the conventional manufacturing method of a semiconductor device having a MOSFET and a diode for detecting temperature, as illustrated in FIG. 9C and FIG. 9D, when the impurity ions are selectively ion-implanted into the polycrystalline silicon layer 104, in order to shield ion implantation into non-implantation regions other than implantation regions, a step for covering the non-implantation regions with the photoresists 112, 113 becomes necessary. In addition, for promotion of efficiency of manufacturing steps, the p region 105 and the n region 106 configuring the diode for detecting temperature are often formed in the same step as the formation of the main element in the active region of the semiconductor substrate 101 by ion implanting (refer to FIGS. 9C and 9D), as described in paragraphs [0022] to [0023] of PTL 1.

However, the conventional diode for detecting temperature has large variation of the forward voltage Vf.

CITATION LIST

Patent Literature

PTL 1: JP 2002-190575 A (FIG. 1, paragraph 0016)
PTL 2: JP 03-34360 A (FIG. 1, First Embodiment)
PTL 3: JP 2007-294670 A (FIG. 6, paragraph 0019)
PTL 4: JP 2010-287786 A (FIG. 3, FIG. 4, paragraphs 0046-0050)

SUMMARY OF INVENTION

Technical Problem

The present invention has been made in view of the above-described points. It is an object of the present invention to provide a manufacturing method of a semiconductor device capable of reducing variation of a forward voltage Vf of a diode for detecting temperature, which is integrated on the same semiconductor chip in a semiconductor substrate.

Solution to Problem

In order to achieve this object, according to one embodiment of the present invention, there is provided a manufacturing method of a semiconductor device including: depositing a thin film semiconductor layer on a semiconductor substrate with an insulating film therebetween, the insulating film having been formed on a surface of the semiconductor substrate; ion-implanting first impurity ions into the thin film semiconductor layer under a condition where a range of the first impurity ions becomes smaller than a film thickness of the thin film semiconductor layer when being deposited; and selectively ion-implanting second impurity ions into the thin film semiconductor layer with a dose quantity more than a dose quantity of the first impurity ions, wherein a diode for detecting temperature is formed by a region into which the first impurity ions have been implanted and a region into which the second impurity ions have been implanted in the thin film semiconductor layer.

Advantageous Effects of Invention

According to one embodiment of the present invention, a manufacturing method of a semiconductor device capable of reducing variation of a forward voltage Vf of a diode for detecting temperature, which is manufactured by ion implantation into a polysilicon layer formed on the surface of an inactive region of a main semiconductor element with an insulating film therebetween, can be provided.

DESCRIPTION OF EMBODIMENTS

Figure 10:
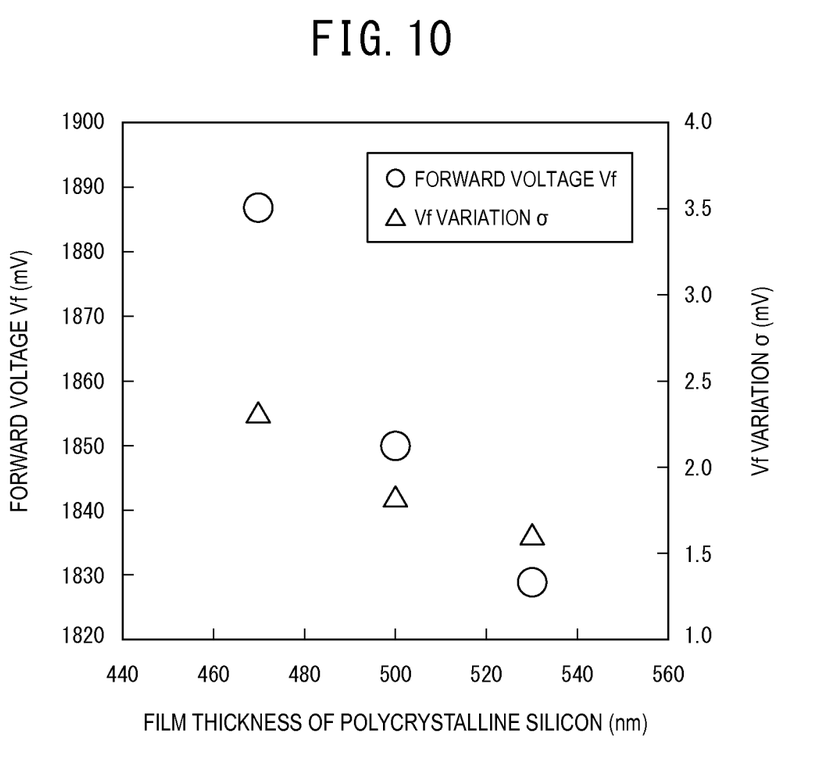
FIG. 10 is a relationship diagram between a film thickness of a polycrystalline silicon layer and a forward voltage Vf when the forward voltage Vf of a conventional temperature sensing diode has a film thickness dependency of the polycrystalline silicon layer.

A relationship between the forward voltage Vf of a diode for detecting temperature, which is formed by a conventional manufacturing method, the variation (standard deviation) σ thereof, and the film thickness of a polycrystalline silicon layer as a starting material, which the present inventors found, is illustrated in FIG. 10. As illustrated in FIG. 10, it was found that the forward voltage Vf of the diode made of a doped polysilicon layer formed by ion implantation in a non-doped polycrystalline silicon layer having a film thickness of about 500 nm has a film thickness dependency in which the forward voltage Vf is decreased as the film thickness is increased when the film thickness of the polycrystalline silicon layer as a starting material changes by about ±30 nm. In addition, it was found that the variation (standard deviation) σ of the forward voltage Vf is large, 1.5 mV or more, and becomes larger in proportion to the forward voltage Vf. Here, in the case where the polycrystalline silicon layer is deposited to have a film thickness of 500 nm, in fact, a film thickness error of about ±30 nm cannot be avoided. Therefore, manufacturing of a diode by ion implantation into a polycrystalline silicon layer as a starting material with high energy of 100 keV or more results in an unstable cause associated with the forward voltage, in which the forward voltage Vf of the diode has variation corresponding to the variation in the film thickness of the polycrystalline silicon layer.

Furthermore, according to the research by the present inventors, during ion implantation, by a phenomenon similar to the channeling phenomenon, that is, a part of ion species slips through silicon crystal lattices and specifically-deeply invades to penetrate the polycrystalline silicon layer, and electrically-ineffective ions are also sometimes generated in a part. As a range of ion implantation approaches the film thickness of the polycrystalline silicon layer, the probability of the occurrence of the channeling phenomenon is increased, and thus, the channeling phenomenon also causes problems in that the value of the forward voltage Vf becomes more unstable and the temperature detection accuracy is more decreased.

In many cases, ion implantation into an active region is usually performed with high energy of 100 keV or more. The above-described problem may be caused by the reason that, when a diode for detecting temperature is formed in a polycrystalline silicon layer having a film thickness of about 500 nm, since low-mass ion species such as boron forming a p region and phosphorus forming an n region have long ranges, if ion implantation is performed with high energy of 100 keV or more in the same step as formation of a main element, the range of phosphorus reaches the total film thickness of the polycrystalline silicon layer. Alternatively, it is thought that the above-described problem is caused by the reason that, even when the range does not reach near the film thickness depending on ion implantation, the region extends to near the film thickness due to thermal diffusion by thermal treatment thereafter.

Hereinafter, a manufacturing method of a semiconductor device according to an embodiment of the present invention will be described in detail with reference to the drawings. In the following description of the embodiment, the description is illustratively made in the case where a first conductivity type is n type and a second conductivity type is p type, but the first conductivity type may be p type and the second conductivity type may be n type by selecting a relationship of inverted conductivity types. In addition, in the present description and the attached drawings, layers and regions indicated with "n" or "p" mean that majority carriers of each of the layers and the regions are respectively electrons or holes. In addition, "+" and "−" appended to "n" and "p" mean that impurity concentrations are relatively higher and lower, respectively, compared to semiconductor regions to which "+" and "−" are not appended.

It is to be noted that, in the following description of the embodiment and the attached drawings, the same configurations are denoted by the same reference numerals, and redundant descriptions are omitted. In addition, the attached drawings described in the embodiment are not drawn by using accurate scale and dimensional ratio for being easily recognized or clearly understood. The invention is not limited to the details of the embodiment described below unless the scope thereof is exceeded.

In the manufacturing method of a semiconductor device according to the embodiment of the present invention, the description is illustratively made by focusing on a manufacturing method of a semiconductor device in which a main element and a diode for detecting temperature are integrated into the same semiconductor chip. Here, the case where a power MOSFET is used as the main element is described. In addition, in the manufacturing method of a semiconductor device according to the embodiment of the present invention, the case where a polycrystalline silicon layer is used as a thin film semiconductor layer in which the diode for detecting temperature is formed is described for convenience, but the thin film semiconductor layer is not limited to the polycrystalline silicon layer. The thin film semiconductor layer may be an amorphous semiconductor layer or the like.

Figure 1:
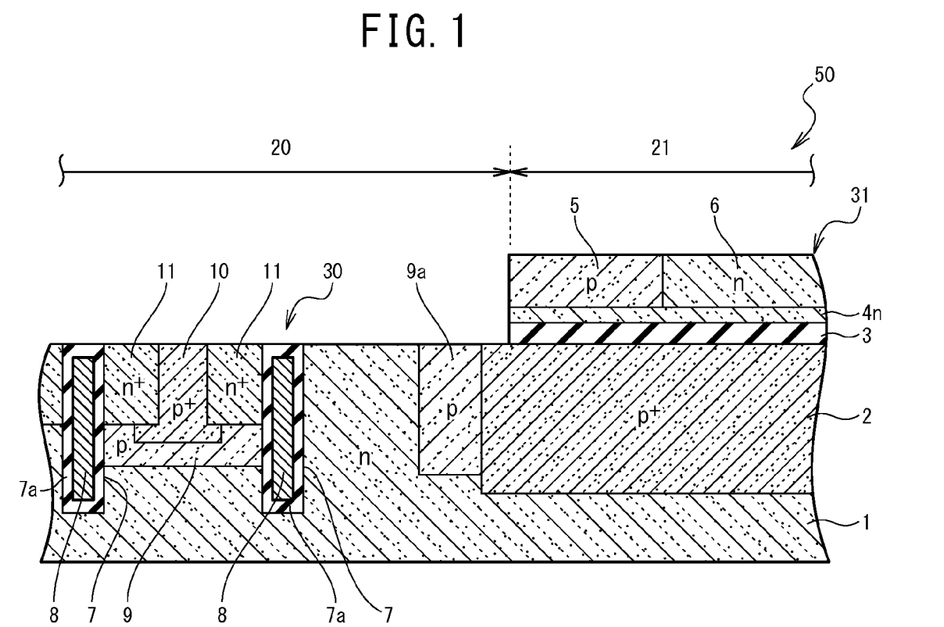
FIG. 1 is a main part cross-sectional diagram of a semiconductor device according to an embodiment of the present invention.

As illustrated in FIG. 1, a semiconductor device 50 according to the embodiment of the present invention is mainly configured by a semiconductor substrate 1 having the second conductivity type (n type) made of single-crystalline silicon, for example, as a semiconductor substrate. The semiconductor substrate 1 has an active region 20 associated with a principal current and an inactive region 21 in the central part of the surface thereof. In addition, although not illustrated, the semiconductor substrate 1 has an edge region associated with pressure resistance reliability in the outer peripheral part surrounding the active region 20. The inactive region 21 is positioned between the active region 20 and the edge region.

The power MOSFET as the main element is formed in the active region 20, and a polycrystalline silicon layer 4 as the thin film semiconductor layer is formed on the inactive region 21 with an insulating film 3 therebetween. Although not illustrated in detail, the power MOSFET has a structure in which plural transistor cells 30 made of fine pattern MOSFETs are electrically connected in parallel to obtain a large amount of power. In FIG. 1, one transistor cell 30 is illustrated.

The transistor cell 30 has a configuration mainly including a trench 7, a gate insulating film 7a, a gate electrode 8, a channel forming region 9, a contact region 10 having the first conductivity type ($p^+$ type), a source region, and a drain region. The trench 7 extends from the surface of the semiconductor substrate 1 in the depth direction. The gate insulating film 7a is formed along the inner wall of the trench 7, and is formed by a silicon dioxide ($SiO_2$) film, for example. The gate electrode 8 is embedded inside the trench 7 with the gate insulating film 7a therebetween, and is formed by a doped polysilicon layer in which impurities for reducing the resistance value are introduced, for example. Although not illustrated in detail, the contact region 10 reduces the contact resistance with an electrode electrically connected to the channel forming region 9, and is formed on the surface layer part of the channel forming region 9. A main element electrode region (source region) 11 is formed by a semiconductor region having the second conductivity type ($n^+$ type) provided on the surface layer part of the channel forming region 9. Although not illustrated in detail, the drain region is formed by the semiconductor substrate 1 and a semiconductor region having the second conductivity type ($n^+$ type) provided on the rear surface of the semiconductor substrate 1.

In the inactive region 21 of the semiconductor substrate 1, a diode protection region 2 having the first conductivity type ($p^+$ type) is provided so as to protect a diode 31 for detecting temperature described below from an electric field of the power MOSFET. An electric field relaxation region 9a having the first conductivity type (p type) is provided between the diode protection region 2 and the transistor cell 30 so as to be in contact with the diode protection region 2. The electric field relaxation region 9a relaxes an electric field of the surface boundary between the semiconductor substrate 1 and the diode protection region 2.

Here, the field effect transistor (FET) is not limited to MOS type in which a gate insulating film is made of an oxide film, and more commonly, may be MIS type made of other insulating films such as a silicon nitride ($Si_3N_4$) film, or an insulating film such as a laminated film of these insulating films and an oxide film.

The diode 31 for detecting temperature is formed in the polycrystalline silicon layer 4. The diode 31 immediately detects an abnormal temperature increase during current application of the power MOSFET and suppresses element destruction due to a thermal runaway. The diode 31 is configured by a first main electrode region (anode) 5 having the first conductivity type (p type) and a second main electrode region (cathode) 6 having the second conductivity type (n type) which are provided on the surface side of the inside of the polycrystalline silicon layer 4 as a starting material.

The first main electrode region 5 and the second main electrode region 6 forma p-n junction while having the surface boundary in the planar direction of the polycrystalline silicon layer 4. The first main electrode region 5 and the second main electrode region 6 extend from the surface of the polycrystalline silicon layer 4 in the depth direction, respectively, as doped polysilicon layers, and are configured such that a non-doped polycrystalline silicon layer 4n is sandwiched between the insulating film 3 and the doped polysilicon layers.

More specifically, the diode 31 has a structure in which a part of the high-resistivity polycrystalline silicon layer 4n is left in the lower layer part, and the first main electrode region 5 and the second main electrode region 6 made of the doped polysilicon layers are provided thereon. In order to obtain the foregoing structure, in the manufacturing method of the semiconductor device 50 according to the embodiment of the present invention, an ion implantation step into the polycrystalline silicon layer 4 as a starting material is not performed at the same time as an ion implantation step of the power MOSFET, and is performed in a separate step from the ion implantation of the power MOSFET under ion implantation conditions where the acceleration energy is reduced. Accordingly, as described above, the depth of the first main electrode region 5 and the second main electrode region 6 (p-n layer) formed on the surface side of the polycrystalline silicon layer 4 can be shallowed, and the diode 31 having a configuration in which the lower layer of the polycrystalline silicon layer 4 is left as the non-doped polycrystalline silicon layer 4 can be integrated.

Finally, by cutting the semiconductor substrate 1 into plural semiconductor chips, the semiconductor device 50 according to the embodiment of the present invention is completed.

Figure 2:
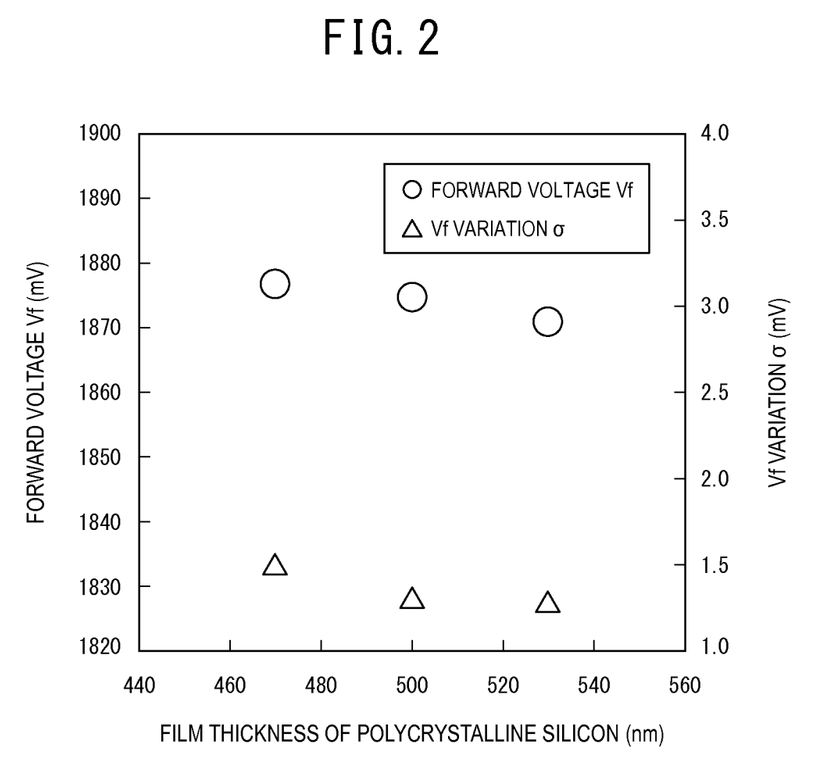
FIG. 2 is a relationship diagram between a film thickness of a polycrystalline silicon layer and a forward voltage Vf when the forward voltage Vf of a diode for detecting temperature according to the embodiment of the present invention has a film thickness dependency of the polycrystalline silicon layer.

A relationship between the forward voltage Vf of the diode 31 formed in this manner, the variation (standard deviation) σ thereof, and the film thickness of the polycrystalline silicon layer 4 as a starting material is illustrated in FIG. 2. According to the result, the diode 31 formed by the manufacturing method of the semiconductor device 50 according to the embodiment of the present invention can obtain an effect in which the value of the forward voltage Vf is stable without depending on the film thickness of the polycrystalline silicon layer 4 and the variation can also be reduced.

The reason is that, whereas the p region of the diode is conventionally formed along the total film thickness of the polycrystalline silicon layer, in the manufacturing method of the semiconductor device 50 according to the embodiment of the present invention, when forming the first main electrode region 5 of the diode 31 as the doped polysilicon layer, the depth of the first main electrode region 5 is made to be shallower than the film thickness of the polycrystalline silicon layer 4 as a starting material by reducing the acceleration energy of the ion implantation. Since the thickness of the first main electrode region 5 can be controlled by the ion implantation conditions by the manufacturing method, it is thought that the forward voltage Vf and the variation (standard deviation) σ thereof can be reduced even if there is variation in the film thickness of the polycrystalline silicon layer 4. Here, the film thickness of the polycrystalline silicon layer 4 as a starting material is preferably 200 nm or more and 600 nm or less. This is because, when the film thickness of the polycrystalline silicon layer 4 is 600 nm or more, the variation of the forward voltage Vf with respect to the variation in the film thickness becomes small, and thus, attention to the variation is not very necessary, and when the film thickness of the polycrystalline silicon layer 4 is 200 nm or less, the ion implantation conditions become difficult.

Next, the manufacturing method of the semiconductor device 50 according to the embodiment of the present invention will be described in detail using FIG. 3 to FIG. 7.

Figure 3:
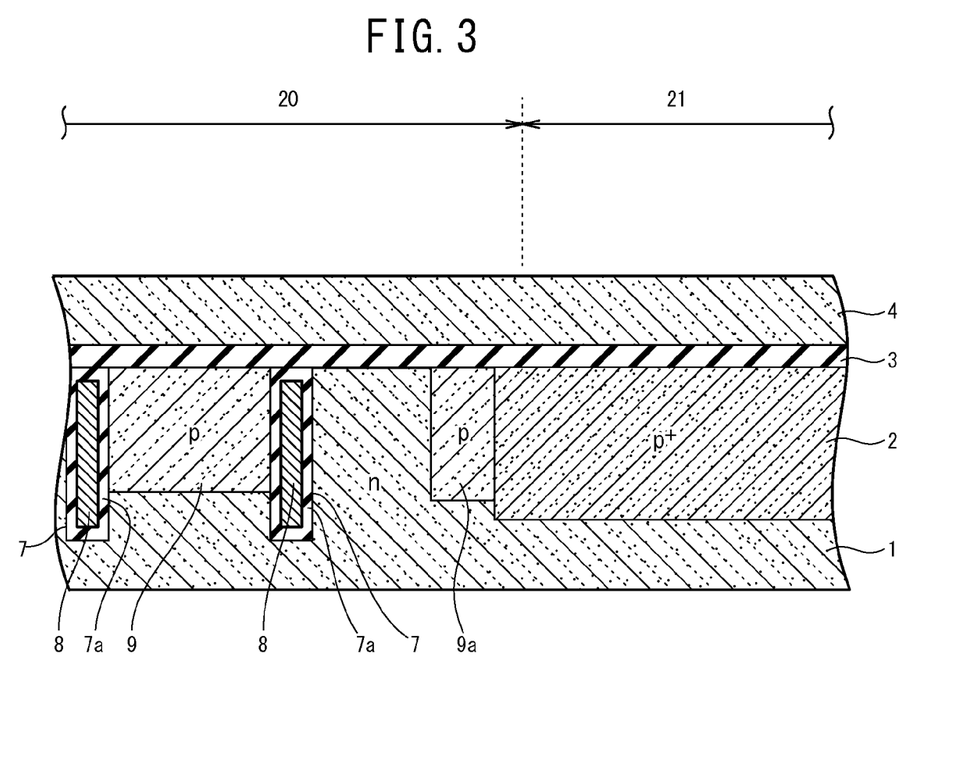
FIG. 3 is a main part cross-sectional diagram for illustrating a manufacturing process flow of the semiconductor device according to the embodiment of the present invention.

Firstly, the semiconductor substrate 1 illustrated in FIG. 3 is prepared, the trench 7 extending from the surface of the semiconductor substrate 1 to be a drift layer in the depth direction is formed by dry etching, and then, after the gate insulating film 7a is formed, the trench is filled with a polycrystalline silicon layer to be the gate electrode 8 with the gate insulating film 7a therebetween. Next, the polycrystalline silicon layer on the surface of the semiconductor substrate 1 and the gate insulating film 7a are selectively removed by etch back. Next, in the active region 20 of the surface of the semiconductor substrate 1, the channel forming region 9 is formed in a part between adjacent trenches 7, and the electric field relaxation region 9a is formed in a part adjacent to the inactive region 21. Furthermore, the diode protection region 2 is formed in the inactive region 21 of the surface of the semiconductor substrate 1. The diode protection region 2, the channel forming region 9, and the electric field relaxation region 9a are formed to have predetermined diffusion depths by selectively forming the respective impurity ion implantation layers with desired patterns by ion implantation using photoresists as masks, and then, performing thermal treatment for activating the impurity ions of the respective ion implantation layers. Accordingly, the diode protection region (well region) 2 having a depth of about 8 μm is formed in a region in which the diode 31 is to be formed, and the electric field relaxation region 9a having a depth of about 4 μm is formed between the trenches 7.

Next, as illustrated in FIG. 3, the insulating film 3 made of an oxide film such as a high temperature silicon oxide film (HTO) having a thickness of about 300 nm, for example, is formed on the whole area of the surface of the semiconductor substrate 1, and then, the non-doped polycrystalline silicon layer 4 having a thickness of about 500 nm, for example, is formed on the insulating film 3 by a chemical vapor deposition (CVD) method.

Figure 4:
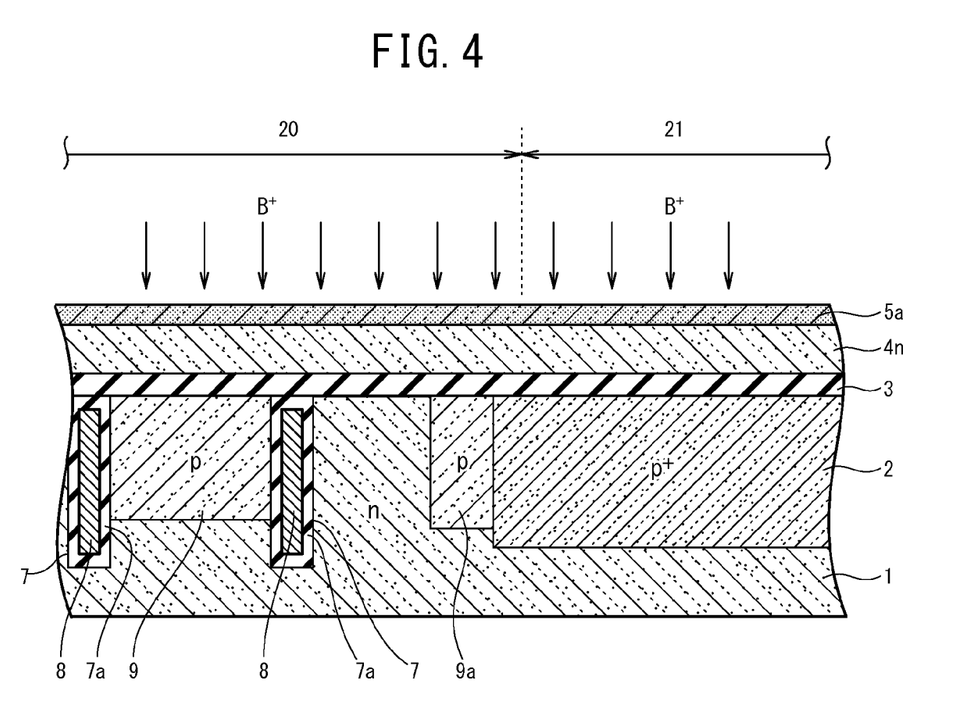
FIG. 4 is a main part cross-sectional diagram for illustrating the manufacturing process flow of the semiconductor device according to the embodiment of the present invention.

Next, as illustrated in FIG. 4, for example, boron (B) ions $B^+$ as first impurity ions are ion-implanted into the whole area of the surface of the polycrystalline silicon layer 4 to form an impurity ion implantation layer 5a on the surface side of the inside of the polycrystalline silicon layer 4. The non-doped polycrystalline silicon layer 4n is left under the impurity ion implantation layer 5a. In this step, the ion implantation of the boron ions $B^+$ is performed under the conditions where a range of the boron ions $B^+$ becomes smaller than the film thickness of the polycrystalline silicon layer 4. The ion implantation of the boron ions $B^+$ is performed at acceleration energy of about 45 keV, for example.

Figure 5:
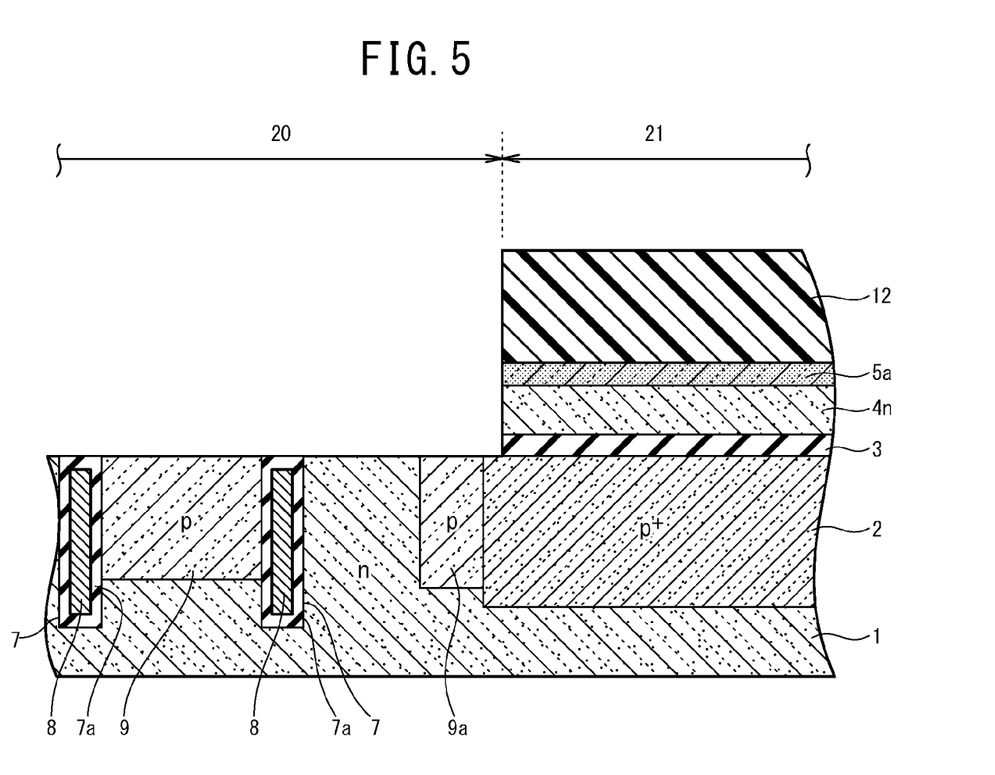
FIG. 5 is a main part cross-sectional diagram for illustrating the manufacturing process flow of the semiconductor device according to the embodiment of the present invention.

Next, as illustrated in FIG. 5, by using a photoresist 12 as an etching mask, the impurity ion implantation layer 5a, the polycrystalline silicon layer 4n, and the insulating film 3 on the outer side of the photoresist 12 are sequentially etched to remove the impurity ion implantation layer 5a, the polycrystalline silicon layer 4n, and the insulating film 3 that is the lower layer thereof, on the active region 20 of the surface of the semiconductor substrate 1. In this step, the non-doped polycrystalline silicon layer 4 is selectively left on the inactive region 21 of the surface of the semiconductor substrate 1 with the insulating film 3 therebetween.

Figure 6:
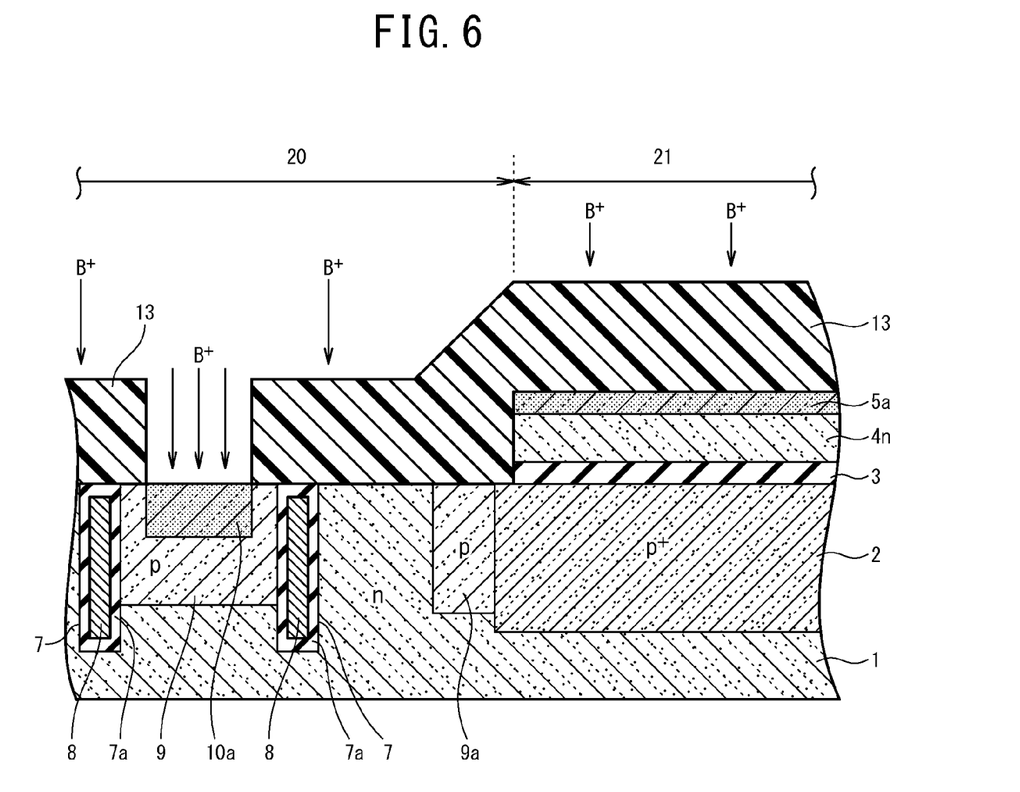
FIG. 6 is a main part cross-sectional diagram for illustrating the manufacturing process flow of the semiconductor device according to the embodiment of the present invention.

Next, after removing the photoresist 12, as illustrated in FIG. 6, by using a photoresist 13 as an ion implantation mask, for example, boron ions $B^+$ as impurity ions are selectively ion-implanted into the active region 20 of the surface of the semiconductor substrate 1 to form an impurity ion implantation layer 10a. In this step, the ion implantation of the boron ions $B^+$ is performed at acceleration energy of about 150 keV, for example.

Figure 7:
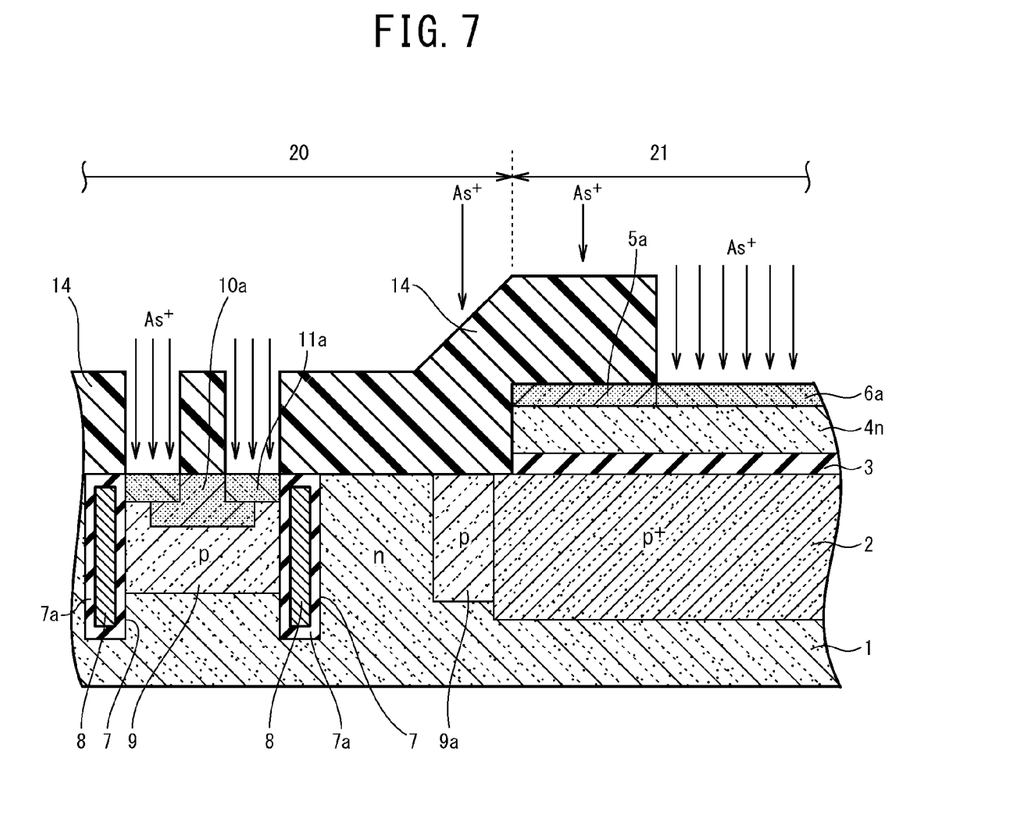
FIG. 7 is a main part cross-sectional diagram for illustrating the manufacturing process flow of the semiconductor device according to the embodiment of the present invention.

Next, after removing the photoresist 13, as illustrated in FIG. 7, by using a photoresist 14 as an ion implantation mask, for example, arsenic ions $As^+$ as impurity ions are selectively ion-implanted into the active region 20 of the surface of the semiconductor substrate 1 and the impurity ion implantation layer 5a on the surface of the polycrystalline silicon layer 4 to form an impurity ion implantation layer 11a in the active region 20 of the semiconductor substrate 1 and to selectively form an impurity ion implantation layer 6a in a part of the impurity ion implantation layer 5a. In this step, the ion implantation of the arsenic ions $As^+$ is performed at acceleration energy of about 120 keV, for example. In addition, in this step, the ion implantation of the arsenic ions $As^+$ is performed with a dose quantity more than a dose quantity of the boron ions $B^+$ in the previous step to change a $p^+$-doped polysilicon layer into an $n^+$-doped polysilicon layer.

Figure 8:
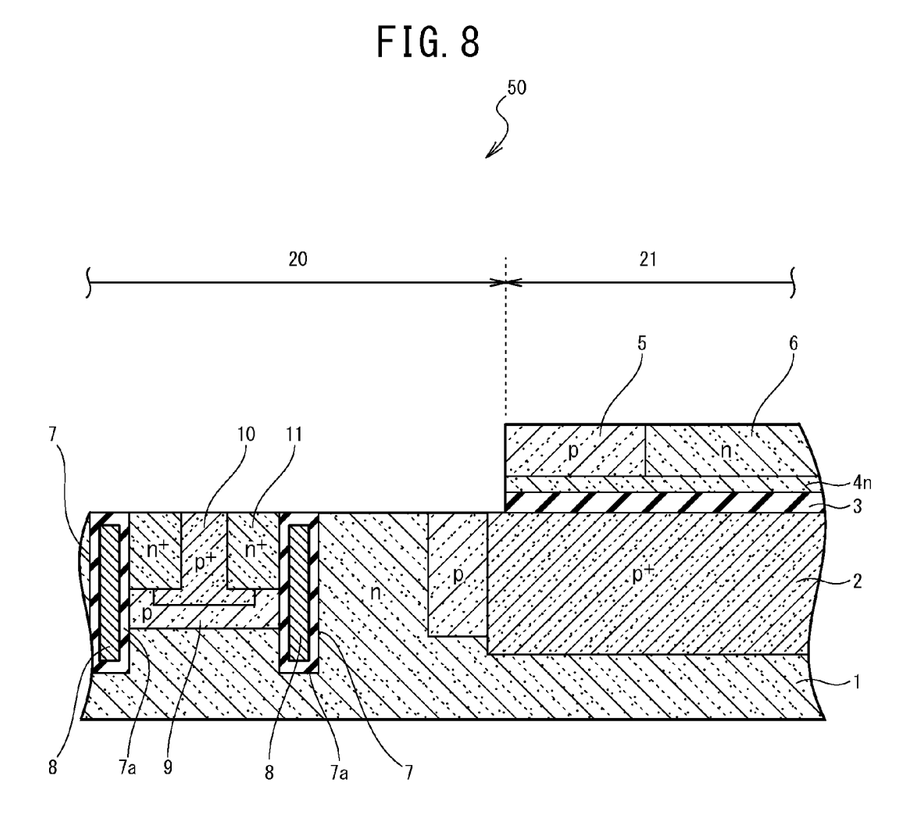
FIG. 8 is a main part cross-sectional diagram for illustrating the manufacturing process flow of a semiconductor device according to the embodiment of the present invention.

Next, after removing the photoresist 14, by performing thermal treatment for activating the respective impurity ions $B^+$ and $As^+$ of the impurity ion implantation layers 10a, 11a in the active region 20 and the impurity ion implantation layers 5a, 6a, as illustrated in FIG. 8, the contact region 10 containing p-type impurities and the main element electrode region 11 containing n-type impurities are formed in the active region 20, and the first main electrode region 5 containing p-type impurities and the second main electrode region 6 containing n-type impurities are formed in the polycrystalline silicon layer 4. According to this step, the diode 31 for detecting temperature, which has the first main electrode region 5 and the second main electrode region 6 that is connected to the first main electrode region 5 by a p-n junction, is formed on the surface of the polycrystalline silicon layer 4. In addition, the non-doped polycrystalline silicon layer 4n is left between the respective bottom parts of the first main electrode region 5 and the second main electrode region 6, and the insulating film 3.

After that, the semiconductor region having the second conductivity type as the drain region is formed on the rear surface that is the opposite side of the surface of the semiconductor substrate 1 so that the transistor cell 30 configuring the power MOSFET is nearly completed.

Here, the conventional ion implantation of the boron ions $B^+$ for forming the contact region 10 of the power MOSFET is usually performed at acceleration energy of about 150 keV, as described in FIG. 6. The range distance in the case where the boron ions $B^+$ are ion-implanted into the polycrystalline silicon layer 4 having a film, thickness of 500 nm at the acceleration energy of about 150 keV is about 420 nm.

Therefore, as the conventional manufacturing method of a semiconductor device illustrated in FIGS. 9A through 9E, when the boron ions for forming the p-type region 105 of the diode for detecting temperature in the polycrystalline silicon layer 104 (refer to FIG. 9D) are ion-implanted in the same step as the impurity ion implantation step for forming the p-type region of the power MOSFET in the active region of the semiconductor substrate 101 (refer to FIG. 9C), the distribution of the p-type region 105 formed by performing thermal treatment for activating the impurity ions thereafter (refer to FIG. 9E) extends from the surface to the bottom surface of the polycrystalline silicon layer 104 as a starting material, that is, extends to the vicinity of the surface boundary with the insulating film 103 that is the lower layer thereof.

In this case, as described above, the film thickness dependency of the impurity concentration becomes prominent. Furthermore, the probability of the occurrence of ion species that penetrate the polycrystalline silicon layer 104 is also increased by the channeling phenomenon so that the amount of electrically-ineffective implanted ions is increased. Therefore, when performing the ion implantation into the polycrystalline silicon layer as a starting material, in which the diode for detecting temperature is formed, at the same time as the ion implantation into the active region, the variation of the forward voltage Vf becomes large due to the film thickness dependency and the increase in the ineffective implanted ions.

In contrast, in the manufacturing method of the semiconductor device 50 according to the embodiment of the present invention, the boron ions $B^+$ for forming the first main electrode region 5 of the diode 31 for detecting temperature (refer to FIG. 8) are ion-implanted into the surface side of the inside of the non-doped polycrystalline silicon layer 4 as a starting material (refer to FIG. 4) in a separate step from the impurity ion implantation step for forming the contact region 10 of the power MOSFET in the active region 20 of the semiconductor substrate 1 (refer to FIG. 6). The boron ions $B^+$ are ion-implanted into the whole area of the surface of the polycrystalline silicon layer 4 having a film thickness of 500 nm as a starting material at acceleration energy lower than the above-described acceleration energy, 150 keV. The implantation energy of the boron ions $B^+$ is reduced to, for example, 45 keV, and thus, the range distance becomes about 145 nm. In this case, as illustrated in FIG. 8, the depth of the p-type first main electrode region 5 after performing the thermal treatment for activating the boron ions $B^+$ does not extend from the surface to the bottom surface of the polycrystalline silicon layer 4 as a starting material, that is, to the vicinity of the surface boundary with the insulating film 3, and the non-doped polycrystalline silicon layer 4n is left between the first main electrode region 5 and the insulating film 3. In addition, the probability of the penetration into the polycrystalline silicon layer 4 by the channeling phenomenon is also reduced, and the film thickness dependency of the forward voltage Vf is also almost lost, as illustrated in FIG. 2.

In addition, in the manufacturing method of the semiconductor device 50 according to the embodiment of the present invention, as illustrated in FIG. 7, the arsenic ions $As^+$ for forming the second main electrode region 6 of the diode 31 (refer to FIG. 8) are ion-implanted into the inside of the polycrystalline silicon layer 4 as a starting material in the same step as the impurity ion implantation step for forming the main element electrode region 11 of the power MOSFET in the active region 20 of the semiconductor substrate 1. Since arsenic ($^{75}As^+$) has a larger mass and a smaller range by ion implantation than phosphorus ($^{31}P^+$), arsenic ions forming the second main electrode region can be ion-implanted in the same step as the ion implantation of the arsenic ions As$^+$ into the active region 20. The ion implantation of the arsenic ions As$^+$ is performed with a dose quantity more than the previous ion implantation of the boron ions B$^+$ so that a part of the impurity ion implantation layer 5a is partially converted into n type to be able to form the second main electrode region 6.

Specifically, when forming the diode 31 for detecting temperature, in which the p-type first main electrode region 5 and the n-type second main electrode region 6 are connected by a p-n junction, it is preferable that the dose quantity of the boron ions B$^+$ that are previously ion-implanted be $1\times10^{15}/cm^2$ to $4\times10^{15}/cm^2$, and the dose quantity of the arsenic ions As$^+$ that are subsequently ion-implanted be sufficiently high, $5\times10^{15}/cm^2$. Accordingly, as illustrated in FIG. 8, the diode 31 having a temperature sensing function can be formed in the polycrystalline silicon layer 4 as a starting material with the non-doped polycrystalline silicon layer 4n left under the first main electrode region 5 and the second main electrode region 6.

Furthermore, the low energy ion implantation process of the boron ions B$^+$ is performed only immediately after the film formation of the polycrystalline silicon layer, and furthermore, the dose quantity is made to be smaller than the implantation quantity of ion species having a different polarity, which are subsequently implanted, for example, phosphorus ions P$^+$ or arsenic ions As$^+$, so that the advantage that one photolithography step can be omitted is obtained.

As described above, according to the manufacturing method of the semiconductor device 50 according to the embodiment of the present invention, by separating the ion implantation of the boron ions B$^+$ for forming the diode 31 in the polycrystalline silicon layer 4 from the ion implantation step of the boron ions B$^+$ for forming the contact region 10 of the power MOSFET in the active region 20 of the semiconductor substrate 1 with high energy, and separately providing the ion implantation step with low energy, deepening of the impurity distribution of boron to the same degree as the film thickness of the polycrystalline silicon layer 4 as a starting material and the penetration of the ion species of the polycrystalline silicon layer 4 by the channeling phenomenon are prevented, and the film thickness dependency of the polycrystalline silicon layer 4 of the forward voltage Vf and the variation thereof can be reduced.

In is to be noted that, in the manufacturing method of a semiconductor device according to the embodiment of the present invention, a manufacturing method of a semiconductor device having a trench gate power MOSFET in which a gate electrode is formed in a trench, as a main element, and a diode has been described. However, the present invention is not limited thereto, and for example, can be applied to a manufacturing method of a semiconductor device having a planar power MOSFET in which a gate electrode is formed on a semiconductor substrate and a diode for detecting temperature. In addition, the present invention can be applied to a manufacturing method of a semiconductor device having a trench gate IGBT and a diode for detecting temperature.

Furthermore, the present invention can be applied to MOS composite devices such as an emitter-switched thyristor (EST), a MOS-controlled thyristor (MCT), a depletion-mode thyristor (DMT), and a MOS field-controlled thyristor (FCT).

In addition, in the manufacturing method of a semiconductor device according to the embodiment of the present invention, the case where a silicon semiconductor substrate is used as a semiconductor substrate has been described, but the present invention is not limited thereto, and for example, can be applied to even the case of a semiconductor device using a semiconductor substrate made of silicon carbide (SiC), gallium nitride (GaN), or the like, as long as a diode for detecting temperature is manufactured using a thin film semiconductor layer.

In addition, in the manufacturing method of a semiconductor device according to the embodiment of the present invention, the case where a polycrystalline semiconductor layer is used as a thin film semiconductor layer in which a diode for detecting temperature is formed has been described, but, as described in the opening, the present invention is not limited thereto, and for example, can be applied to a manufacturing method of a semiconductor device using an amorphous semiconductor layer.

INDUSTRIAL APPLICABILITY

As described above, a manufacturing method of a semiconductor device according to the present invention can reduce variation of a forward voltage Vf of a diode for detecting temperature, which is integrated on the same chip using a thin film semiconductor layer, and is useful for a manufacturing method of a semiconductor device having a main element and a diode for detecting temperature, such as an intelligent power device or power IC.

REFERENCE SIGNS LIST 1 semiconductor substrate
2 diode protection region
3 insulating film
4 polycrystalline silicon layer
5 first main electrode region
5a impurity ion implantation layer
6 second main electrode region
6a impurity ion implantation layer
7 trench
7a gate insulating film
8 gate electrode
9 channel forming region
9a electric field relaxation region
10 contact region
11 main element electrode region (source region)
12, 13, 14 photoresist
20 active region
21 inactive region
30 transistor cell
31 diode for detecting temperature
50 semiconductor device

The invention claimed is:
1. A manufacturing method of a semiconductor device comprising:
depositing a thin film semiconductor layer on a semiconductor substrate with an insulating film therebetween, the insulating film having been formed on a surface of the semiconductor substrate, and the thin film semiconductor layer being deposited to a film thickness;
ion-implanting first impurity ions into the thin film semiconductor layer such that the first impurity ions reach only a partial thickness, less than an entirety of the film thickness, of the thin film semiconductor layer;

selectively ion-implanting second impurity ions into the thin film semiconductor layer with a dose quantity per unit area more than a dose quantity per unit area of the first impurity ions;

forming a diode for detecting temperature is formed by performing thermal treatment to activate the first and second impurity ions ion-implanted into the thin film semiconductor layer to thereby respectively form a first main electrode region having a first conductivity type and a second main electrode region having a second conductivity type in the thin film semiconductor layer, the first main electrode region and the second main electrode region being thinner than the film thickness.

2. The manufacturing method of a semiconductor device according to claim 1, wherein
the thin film semiconductor layer is a polycrystalline silicon layer.

3. The manufacturing method of a semiconductor device according to claim 2, wherein
the film thickness of the thin film semiconductor layer is 200 nm or more and 600 nm or less.

4. The manufacturing method of a semiconductor device according to claim 1, comprising:
integrating a main element in a region different from a part of the semiconductor substrate, in which the diode is formed.

5. The manufacturing method of a semiconductor device according to claim 4, wherein
the integrating the main element comprises forming a contact region having the first conductivity type by ion-implanting third impurity ions into the surface of the semiconductor substrate.

6. The manufacturing method of a semiconductor device according to claim 5, wherein
the ion implantation of the first impurity ions is performed in a separate step from the ion implantation of the third impurity ions.

7. The manufacturing method of a semiconductor device according to claim 6, wherein
the film thickness of the thin film semiconductor layer is 200 nm or more and 600 nm or less.

8. The manufacturing method of a semiconductor device according to claim 1, wherein
the ion implantation of the first impurity ions is performed on a whole area of the thin film semiconductor layer.

9. The manufacturing method of a semiconductor device according to claim 8, wherein
the first impurity ions are boron.

10. The manufacturing method of a semiconductor device according to claim 9, wherein
the film thickness of the thin film semiconductor layer is 200 nm or more and 600 nm or less.

11. The manufacturing method of a semiconductor device according to claim 1, wherein
the film thickness of the thin film semiconductor layer is 200 nm or more and 600 nm or less.

12. The manufacturing method of a semiconductor device according to claim 4, wherein
the film thickness of the thin film semiconductor layer is 200 nm or more and 600 nm or less.

13. The manufacturing method of a semiconductor device according to claim 5, wherein
the film thickness of the thin film semiconductor layer is 200 nm or more and 600 nm or less.

14. The manufacturing method of a semiconductor device according to claim 8, wherein
the film thickness of the thin film semiconductor layer is 200 nm or more and 600 nm or less.

15. The manufacturing method of a semiconductor device according to claim 1, wherein
in the ion-implating first impurity ions, the first impurity ions are implanted into a first implantation region and a second implantation region of the thin film semiconductor layer,
in the selectively ion-implanting second impurity ions, the second impurity ions are implanted into the second implantation region of the thin film semiconductor layer, and
in the forming the diode, the first and second main electrode regions are formed from the first and second implantation regions, respectively.

* * * * *